United States Patent [19]

Kim et al.

[11] Patent Number: 5,721,755
[45] Date of Patent: Feb. 24, 1998

[54] SERIAL TRANSFER SYSTEM

[75] Inventors: Jong Kyu Kim; Moon Ki Lee; Ho Woong Lee, all of Wheeling, Ill.

[73] Assignee: Goldstar Co., Ltd., Seoul, Rep. of Korea

[21] Appl. No.: 718,990

[22] Filed: Sep. 26, 1996

Related U.S. Application Data

[63] Continuation of Ser. No. 258,106, Jun. 10, 1994, abandoned.
[51] Int. Cl.$^6$ .................................................. H04L 27/00
[52] U.S. Cl. .......................... 375/259; 375/297; 375/359; 375/369; 375/376; 348/547
[58] Field of Search ................................. 375/259, 240, 375/295, 297, 359, 362, 363, 365, 369, 371, 376; 348/505, 512, 513, 525, 547

[56] References Cited

U.S. PATENT DOCUMENTS

4,146,909  3/1979  Beckenhauer et al. ............... 360/39

Primary Examiner—Don N. Vo
Attorney, Agent, or Firm—Finnegan, Henderson, Farabow, Garrett & Dunner, L.L.P.

[57] ABSTRACT

A serial transfer system for performing serial data transfer between transmission and reception stages which have phase locked loops for generating reference clock signals. The serial transfer system has a transmission circuit and a reception circuit. The a transmission circuit converts parallel data from the transmission stage into a serial data signal at the same time that it appends a data marker to the parallel data in response to the reference clock signals from the phase locked loop of the transmission stage and transmits the converted serial data signal through a coaxial cable. The reception circuit receives the serial data signal from the transmission circuit through the coaxial cable, converts the received serial data signal into the original parallel data using its appended data marker and the reference clock from the phase locked loop of the reception stage and outputs the converted parallel data to the reception stage.

14 Claims, 9 Drawing Sheets

SERIAL TRANSFER SYSTEM

This is a continuation of application Ser. No. 08/258,106, filed Jun. 10, 1994 now abandoned.

BACKGROUND OF THE INVENTION

The present invention relates to a serial transfer system for performing data transfer between a high definition television (referred to hereinafter as HDTV) and a high definition video cassette recorder (referred to hereinafter as HDVCR) in a serial transfer manner employing a coaxial cable.

Figure 1:
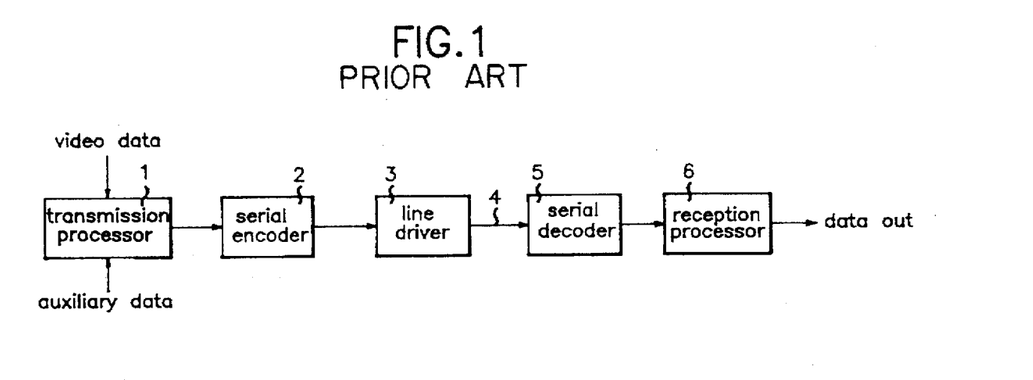
FIGS. 1 and 2 are block diagrams of a serial interface circuit and a clock processing circuit of a conventional serial transfer system, respectively.
Figure 2:
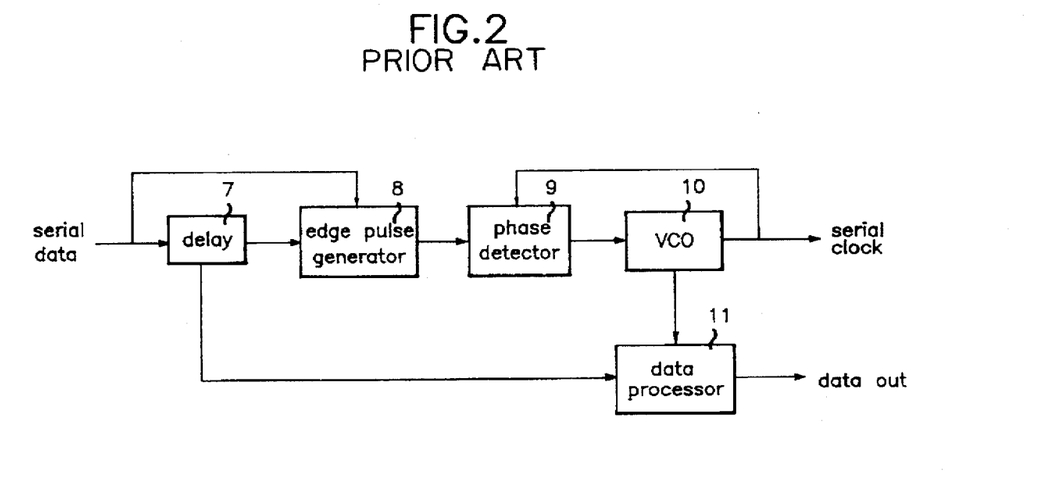

FIGS. 1 and 2 are block diagrams of a serial interface circuit and a clock processing circuit of a conventional serial transfer system, respectively. As shown in FIG. 1, the serial interface circuit includes a transmission processor 1 which receives video data and auxiliary data and processes the received data to output parallel data to be transmitted. A serial encoder 2 converts the parallel data from the transmission processor 1 into serial data. A line driver 3 buffers and drives the serial data from the serial encoder 2 to transmit it stably through a coaxial cable 4. A serial decoder 5 receives the serial data from the line driver 3 through the coaxial cable 4 and converts the received serial data into the original parallel data. A reception processor 6 processes the parallel data from the serial decoder 5 so that it can be processed at a reception stage.

The clock processing circuit, as shown in FIG. 2, includes a delay 7 that receives the serial data from the line driver 3 through the coaxial cable 4 and delays the received serial data. An edge pulse generator 8 generates an edge pulse in response to the serial data from the line driver 3 and the delayed serial data from the delay 7. A phase detector 9 detects a phase in response to an output signal from the edge pulse generator 8. A voltage controlled oscillator (VCO) 10 receives an output signal from the phase detector 9 as a reference signal, generates a serial clock in response to the received reference signal, and feeds back the generated serial clock to the phase detector 9. A data processor 11 for reclocks the delayed serial data from the delay 7 in response to the serial clock from the VCO 10. Here, the phase detector 9 and the VCO 10 constitute a phase locked loop (PLL).

The operation of the conventional serial transfer system with the above-mentioned construction will hereinafter be described.

First, upon receiving the video data and the auxiliary data, the transmission processor 1 processes the received data to output the parallel data to be transmitted. The parallel data from the transmission processor 1 is converted into serial data by the serial encoder 2, buffered and driven by the line driver 3 and then transmitted through the coaxial cable 4.

The serial data transmitted through the coaxial cable 4 is converted into parallel data by the serial decoder 5 and then processed by the reception processor 6 so that it can be processed at the reception stage.

For the purpose of making the serial transfer smooth, channel coding is used to produce edge information for the preferred operation of the PLL. The channel coding is generally performed by the serial encoder 2. Well-known channel coding techniques, include: Non Return to Zero, Non Return to Zero Inverted, Bi-Phase Mark as Manchester Code, Miller coding and etc. These coding techniques compare input data with a reference clock signal to produce the edge information for the preferred operation of the PLL.

On the other hand, the serial data transmitted through the coaxial cable 4 is delayed by the delay 7 and then applied to the edge pulse generator 8. The serial data transmitted through the coaxial cable 4 is also applied directly to the edge pulse generator 8. In response to the received data, the edge pulse generator 8 generates the edge pulse to be used as information for locking the PLL. The edge pulse from the edge pulse generator 8 is compared in phase with the serial clock signal from the VCO 10 by the phase detector 9. In accordance with the compared result, the VCO 10 is controlled to generate the serial clock signal and output the generated serial clock signal to the data processor 11. As a result, the data processor 11 reclocks the delayed serial data from the delay 7 in response to the serial clock signal from the VCO 10.

Figure 3:
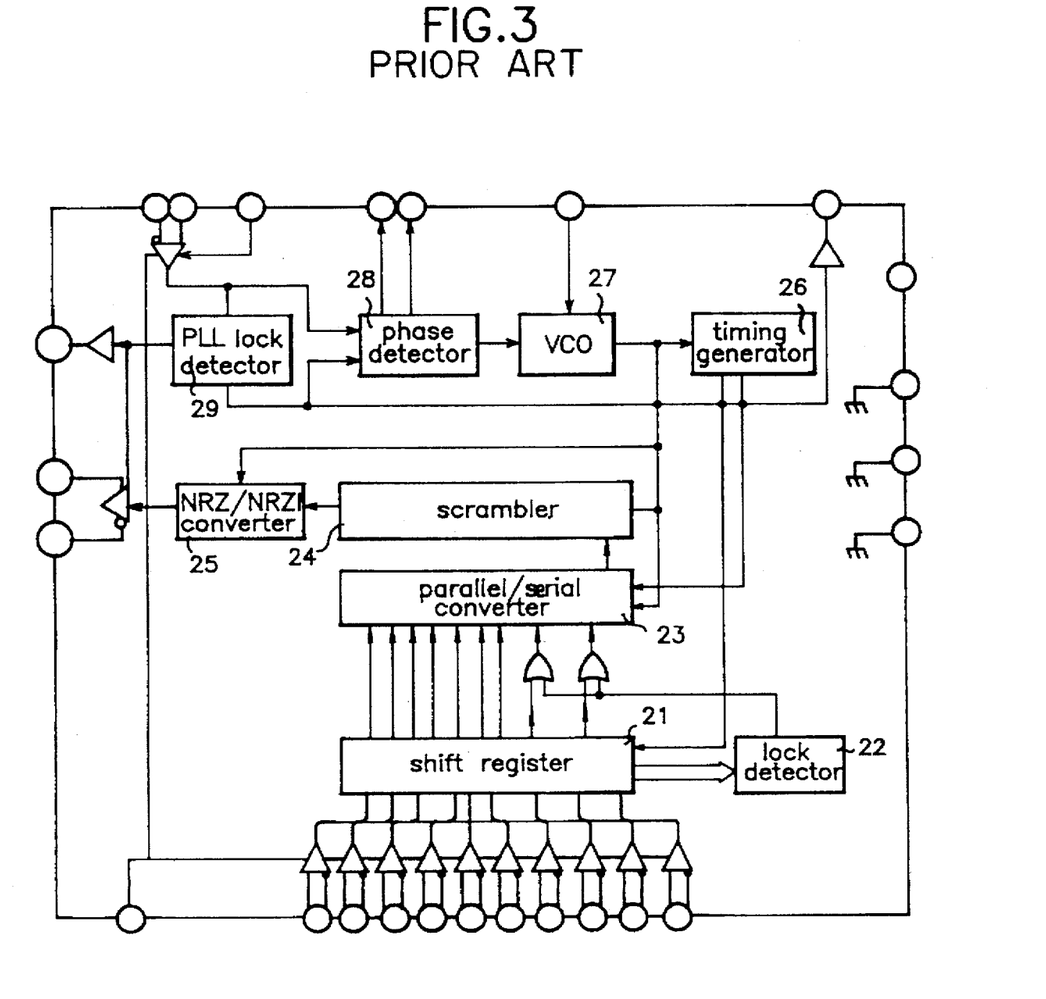
FIGS. 3 and 4 are block diagrams of a serial encoder and a serial decoder in the serial interface circuit in FIG. 1, respectively.
Figure 4:
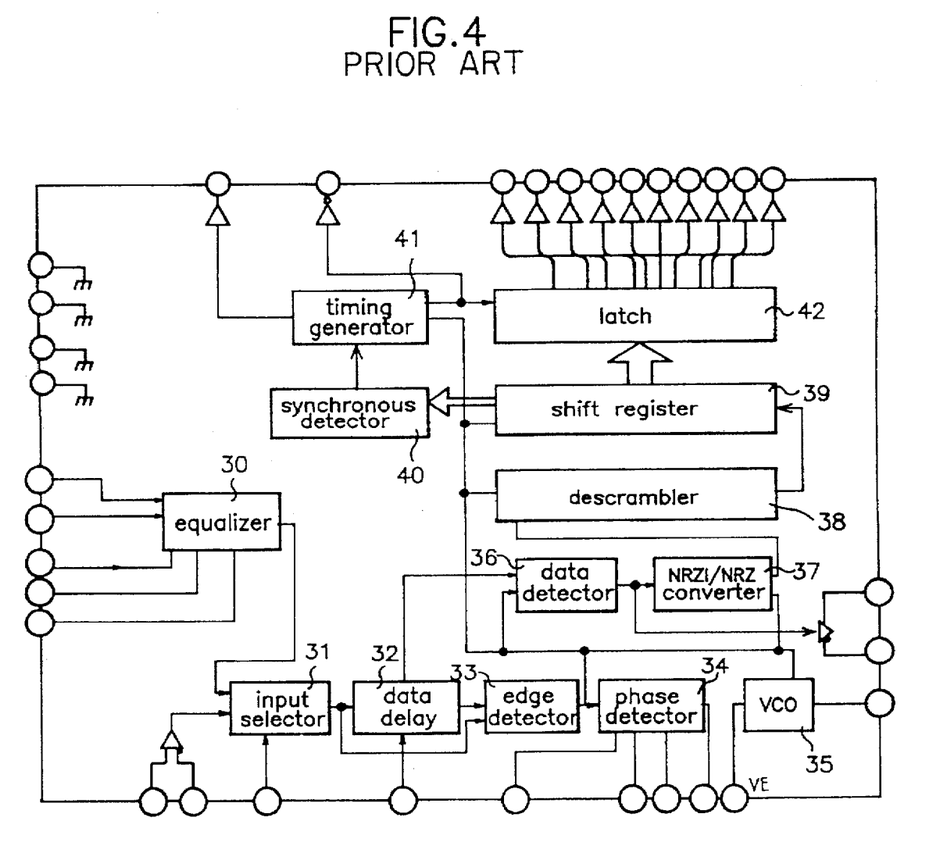

FIGS. 3 and 4 are block diagrams of the serial encoder 2 and the serial decoder 5 in the serial interface circuit in FIG. 1, respectively. The serial encoder 2 and the serial decoder 5 may be available from SONY Corp. for transfer of a 10-bit 4:2:2 component signal or a 10-bit 4fsc NTSC composite digital signal in a Society of Motion Picture and Television Engineers (SMPTE) 259M manner.

As shown in FIG. 3, the serial encoder 2 includes 10 bits×3 words shift register 21 that shifts the parallel data from the transmission processor 1. A $000_{HEX}$ detector 22 detect a synchronous signal from the shifted parallel data from the shift register 21. A parallel/serial converter 23 for converts the shifted parallel data from the shift register 21 into serial data. A scrambler 24 scrambles the serial data from the parallel/serial converter 23 according to an expression of $X^9+X^4+1$ to make clock detection at the reception stage easy. A Non Return To Zero/Non Return To Zero Inverted (NRZ/NRZI) converter 25 converts an output signal from the scrambler 24 into an NRZI signal to remove data polarity.

A PLL lock detector 29, a phase detector 28 and a VCO 27 are provided in the serial encoder 2 to cooperate to generate a reference clock signal.

A timing generator 26 is also provided in the serial encoder 2 to generate a clock for data transfer in response to the reference clock generated by the PLL lock detector 29, the phase detector 28 and the VCO 27.

The serial decoder 5, as shown in FIG. 4, includes an equalizer 30 for equalizing the serial data from the serial encoder 2. A input selector 31 selects one of an output signal from the equalizer 30 and a differential digital signal inputted therein. A data delay 32 delays serial data from the input selector 31. An edge detector 33 detects an edge from the delayed serial data from the data delay 32 and the serial data from the input selector 31.

A phase detector 34 and a VCO 35 are provided in the serial decoder 5 to cooperate to generate a reference clock signal in response to an output signal from the edge detector 33.

The serial decoder 5 also includes a data detector 36 for detecting a desired data portion from the delayed serial data from the data delay 32 in response to the reference clock from the VCO 35. An NRZI/NRZ converter 37 converts the detected data portion from the data detector 36 into NRZ data. A descrambler 38 for descrambles the NRZ data from the NRZI/NRZ converter 37 according to the expression of $X^9+X^4+1$. A shift register 39 shifts descrambled serial data from the descrambler 38. A synchronous detector 40 detects a synchronous signal from the shifted serial data from the shift register 39. A timing generator 41 generates a clock for the data transfer in response to the detected synchronous signal from the synchronous detector 40. A 10-bit latch 42 latches the shifted serial data from the shift register 39 in response to the signal from the timing generator 41 to output the original parallel data.

The operations of the serial encoder 2 and the serial decoder 5 with the above-mentioned constructions will hereinafter be described.

A 10-bit input signal D0–D9 is the 4:2:2 component signal or the 4fsc NTSC composite digital signal. The input signal is formatted in an ANSI/SMPTE 125M manner if it is the 4:2:2 component signal, or in an SMPTE 244M manner if it is the 4fsc NTSC composite digital signal.

When such a parallel signal is received by the serial encoder 2, it is shifted by the shift register 21 and then applied to the $000_{HEX}$ detector 22, which detects the synchronous signal $000_{HEX}$ from the shifted parallel data from the shift register 21. Also, the shifted parallel data from the shift register 21 is converted into the serial data by the parallel/serial converter 23 and then channel-coded into the scrambled NRZI signal by the scrambler 24 and the NRZ/NRZI converter 25. At this time, the reference signal is generated by the PLL lock detector 29, the phase detector 28 and the VCO 27 and then applied to the timing generator 26. In response to the reference clock signal from the VCO 27, the timing generator 26 generates the clock signal for the data transfer and outputs the generated clock to the parallel/serial converter 23.

In the serial decoder 5, the serial data from the serial encoder 2 is equalized by the equalizer 30 and then applied to the input selector 31, which also receives the differential digital signal. The input selector 31 selects either of the output signal from the equalizer 30 or the differential digital signal. The output signal from the input selector 31 is delayed by the data delay 32 and then applied to the edge detector 33. The output signal from the input selector 31 is also applied directly to the edge detector 33.

The edge detector 33 detects the edge from the received signals and outputs the detected edge as a control signal to the phase detector 34, thereby to lock a PLL comprised of the phase detector 34 and the VCO 35. While locked, the phase detector 34 and the VCO 35 cooperate to generate the reference clock signal. In response to the reference clock signal from the VCO 35, the data detector 36 detects the desired data portion from the delayed serial data from the data delay 32. The detected data portion from the data detector 36 is converted into the NRZ data by the NRZI/NRZ converter 37, descrambled by the descrambler 38, and then shifted by the shift register 39.

The synchronous detector 40 detects the synchronous signal from the shifted serial data from the shift register 39 and outputs the detected synchronous signal to the timing generator 41, which also receives the reference clock signal from the VCO 35. The timing generator 41 generates the clock signal for the data transfer in response to the received signals. Then, the 10-bit latch 42 latches the shifted serial data from the shift register 39 in response to the clock signal from the timing generator 41. As a result, the original parallel data is outputted from the latch 42.

However, the above-mentioned conventional serial transfer system has a disadvantage in that the transmitter and the receiver have VCOs, respectively, resulting in an increase in the cost. Also, the above-mentioned conventional serial transfer system comprises the scrambler, the NRZ/NRZI converter, the equalizer, the descrambler and the NRZI/NRZ converter in spite of complexity in a hardware and the associated circuitry.

SUMMARY OF THE INVENTION

Therefore, the present invention has been made in view of the above problems, and it is an object of the present invention to provide a serial transfer system for performing serial data transfer using PLLs in transmission and reception stages with no self-PLL.

In accordance with the present invention, the above and other objects can be accomplished by a provision of a serial transfer system for performing serial data transfer between transmission and reception stages which have phase locked loops for generating reference clocks, respectively, said system comprising transmission means for converting parallel data from said transmission stage into a serial data signal at the same time that it appends a data marker to the parallel data, or in other words, with a data marker appended to the parallel data, in response to the reference clock from said phase locked loop of said transmission stage and transmitting the converted serial data signal through a coaxial cable; and reception means for receiving the serial data signal from said transmission means through the coaxial cable, converting the received serial data signal into the original parallel data using its appended data marker and the reference clock from said phase locked loop of said reception stage and outputting the converted parallel data to said reception stage.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF THE PREFERRED EMBODIMENT

Figure 5:
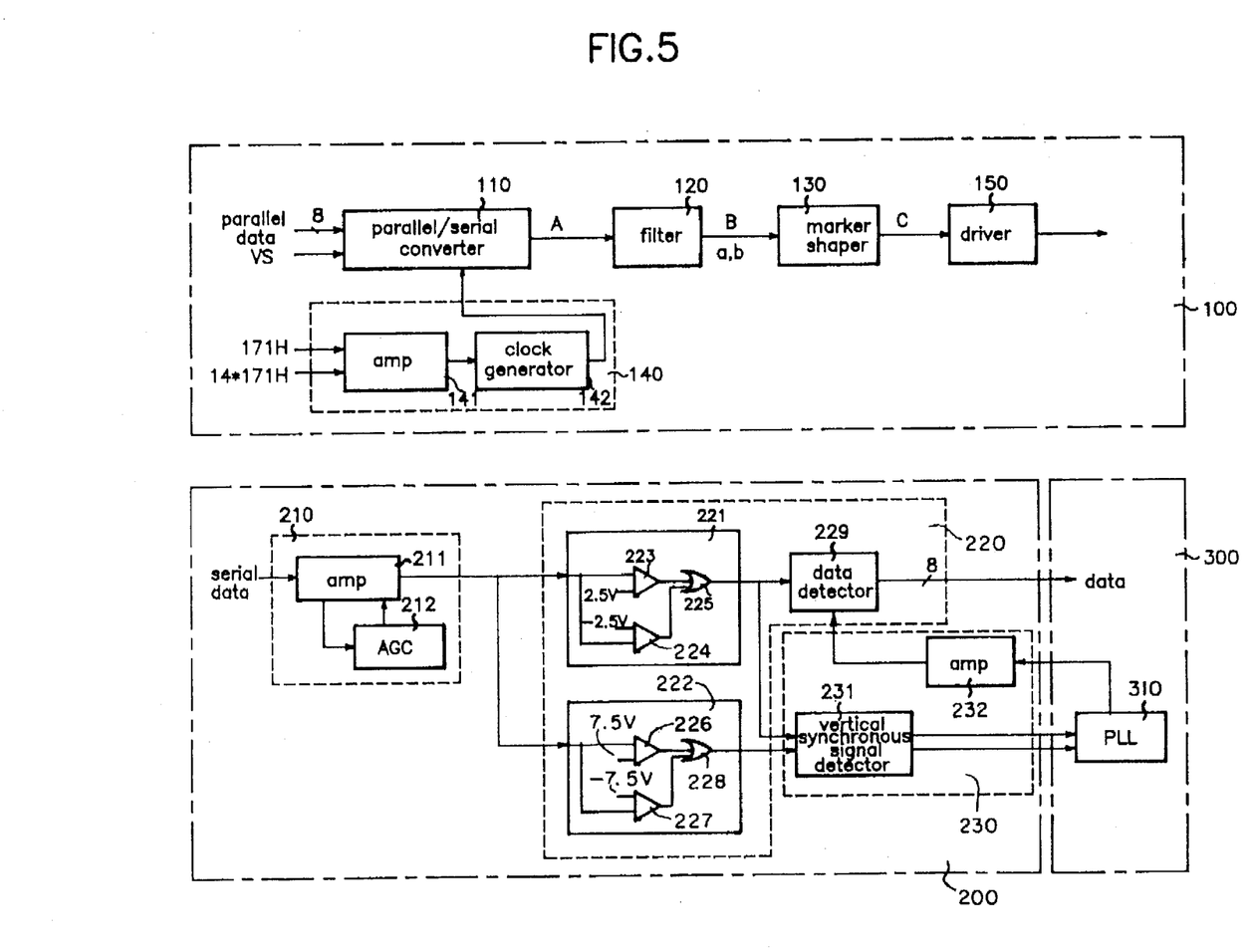
FIG. 5 is a block diagram of a serial transfer system in accordance with the present invention.

Referring to FIG. 5, there is shown a block diagram of a serial transfer system in accordance with an embodiment of the present invention. As shown in this drawing, the serial transfer system includes comprises a transmission circuit 100 that converts parallel data from a transmission stage into a serial data signal at the same time that it appends a data marker to the parallel data, or in other words, with a data marker appended to the parallel data, in response to a reference clock signal from a PLL of a transmites stage (not shown) and transmitting the converted serial data signal through a coaxial cable. A reception circuit 200 receives the serial data signal from the transmission circuit 100 through the coaxial cable, converts the received serial data signal into the original parallel data using the appended data marker and a reference clock signals from a PLL 310 of a reception stage 300, and outputs the converted parallel data to the reception stage 300.

The transmission circuit 100 includes a timing generator 140 a parallel/serial converter 110, a filter 120, a marker shaper 130, and a driver 150. The timing generator 140 generates a clock for serial transfer in response to the reference clock from the PLL of the transmission stage. The parallel/serial converter 110 both converts the parallel data from the transmission stage into the serial data signal and appends the data marker to the parallel data in response to the clock signals from the timing generator 140. The filter 120 remove a direct current (DC) component from the serial data signal from the parallel/serial converter 110. The marker shaper 130 varies the number of voltage levels of an output signal from the filter 120 to 5 to facilitate data marker slicing. The driver 150 buffers and drives an output signal from the marker shaper 130 to transmit it through the coaxial cable.

The reception circuit 200 includes an amplification circuit 210, a serial/parallel converter 220, and a timing generator 230. The amplification circuit 210 receives the serial data signal from the transmission circuit 100 through the coaxial cable and amplifying the received serial data signal. The serial/parallel converter 220 slices an output signal from the amplification circuit 210, converts the sliced signal into the original parallel data, and outputs the converted parallel data to the reception stage 300. The timing generator 230 controls the PLL 310 of the reception stage 300 according to the data marker from the serial/parallel converter 220, generates a clock signals for parallel transfer in accordance with the controlled result and outputs the generated clock signal to the serial/parallel converter 220.

The timing generator 140 includes an amplifier 141 and a clock generator 142. The amplifier 141 amplifies the reference clock from the PLL of the transmission stage by a transistor transistor logic (TTL) level. The clock generator 142 generates the clock signal for the serial transfer in response to an output signal from the amplifier 141 and outputs the generated clock signal to the parallel/serial converter 110. Here, the reference clock signal from the PLL of the transmission stage has a frequency of 75 MHz and the clock signal for the serial transfer, generated from the clock generator 142 has a frequency of 37.5 MHz (14×171H).

The amplification circuit 210 includes an amplifier 211 and an auto gain controller 212. The amplifier 211 receives the serial data signal from the transmission circuit 100 through the coaxial cable and amplifies the received serial data signal. The auto gain controller (AGC) 212 controls the a gain of the amplifier 211 in response to an output signal from the amplifier 211.

The serial/parallel converter 220 includes a data slicer 221, a marker slicer 222, and a data detector 229. The data slicer 221 slices a data portion of the output signal from the amplifier 211 in the amplification circuit 210. The marker slicer 222 slices a data marker portion of the output signal from the amplifier 211 in the amplification circuit 210. The data detector 229 detects serial data from an output signal from the data slicer 221 in response to the clock signal from the timing generator 230, converts the detected serial data into the original parallel data and outputs the converted parallel data to the reception stage 300.

The timing generator 230 includes a vertical synchronous signal detector 231 and an amplifier 232. The signal detector 231 detects a vertical synchronous signal VS from the output signal from the data slicer 221 in response to an output signal from the marker slicer 222 and outputs the detected vertical synchronous signal VS as a reference control signal for controlling generation of the reference clock in the PLL 310 of the reception stage 300. The amplifier 232 amplifies the reference clock signal from the PLL 310 of the reception stage 300 by the TTL level to generate the clock signal for the parallel transfer and outputs the generated clock signal to the data detector 229 in the serial/parallel converter 220. Here, the reference clock signal from the PLL 310 of the reception stage 300 and the clock signal for the parallel transfer, generated from the amplifier 232 have frequencies of 2.69 MHz (171H), respectively.

The data slicer 221 includes a comparator 223, a comparator 224, and an OR gate 225. The comparator 223 compares a level of the output signal from the amplifier 211 with a reference voltage of 2.5V, comparator 224 compares the level of the output signal from the amplifier 211 with a reference voltage of −2.5V. The OR gate 225 ORs output signals from the comparators 223 and 224 and outputs the ORed signal to the data detector 229 and the vertical synchronous signal detector 231 in the timing generator 230.

The marker slicer 222 includes a comparator 226, a comparator 227, and an OR gate 228. The comparator 226 compares a level of the output signal from the amplifier 211 with a reference voltage of 7.5V. The comparator 227 compares the level of the output signal from the amplifier 211 with a reference voltage of −7.5V. The OR gate 228 ORs output signals from the comparators 226 and 227 and outputs the ORed signal to the vertical synchronous signal detector 231 in the timing generator 230.

Figure 6:
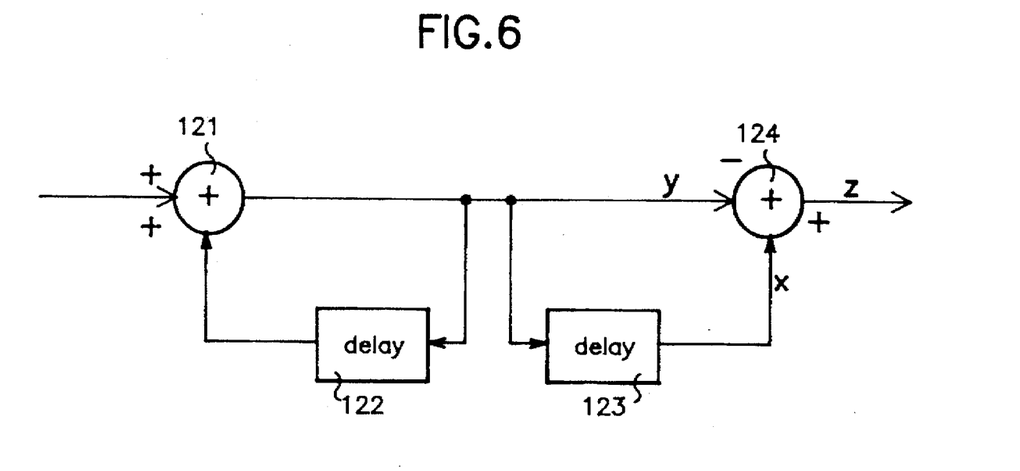
FIG. 6 is a detailed block diagram of a filter in FIG. 5.

Referring to FIG. 6, there is shown a detailed block diagram of the filter 120 in FIG. 5. As shown in this drawing, the filter 120 includes an adder 121, a delay 122, a delay 123, and a subtracter 124. The adder 121 performs a modulo-2 operation with respect to the serial data signal from the parallel/serial converter 110. The delay 122 delays an output signal from the adder 121 and feeds back the delayed signal to the adder 121. The delay 123 delays the output signal from the adder 121. The subtracter 124 subtracts the output signal from the adder 121 from an output signal from the delay 123.

Figure 7:
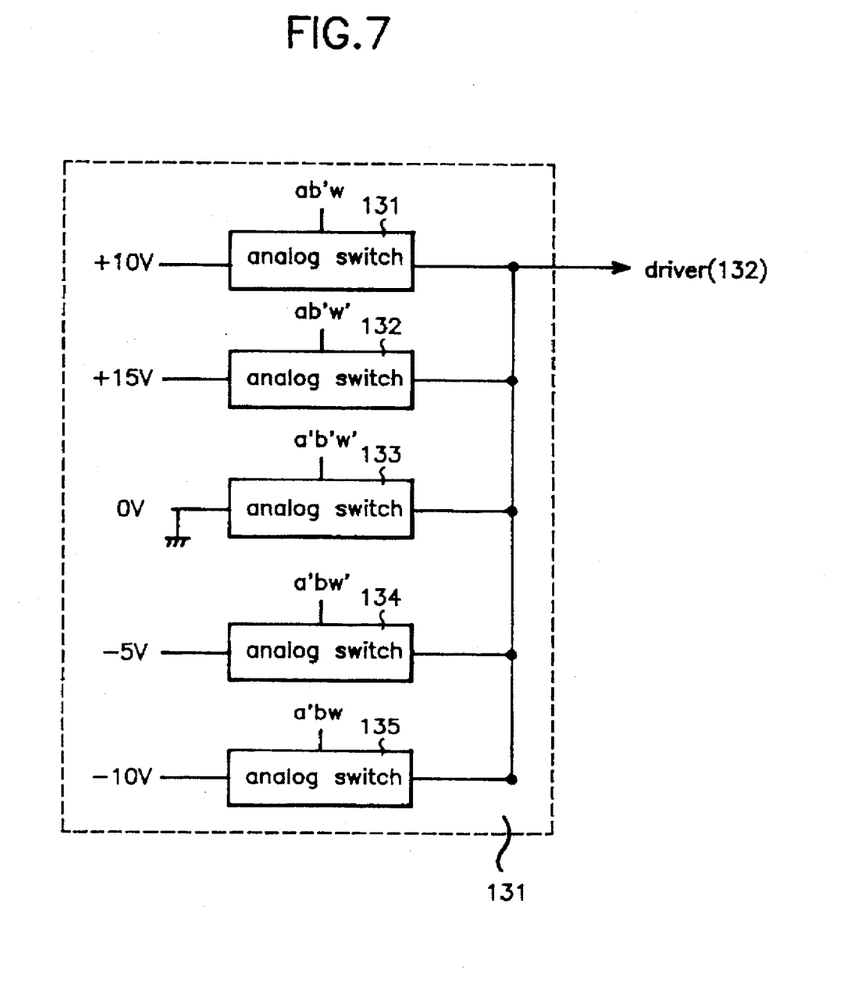
FIG. 7 is a detailed block diagram of a marker shaper in FIG. 5.

Referring to FIG. 7, there is shown a detailed block diagram of the marker shaper 130 in FIG. 5. As shown in this drawing, the marker shaper 130 includes analog switches 131–135. The analog switch 131 performs a switching operation in response to the output signal from the filter 120 to output a 2-level signal of +10V. The analog switch 132 performs a switching operation in response to the output signal from the filter 120 to output a 1-level signal of +5V, an analog switch 133 performs a switching operation in response to the output signal from the filter 120 to output a 0-level signal of 0V, an analog switch 134 performs a switching operation in response to the output signal from the filter 120 to output a −1-level signal of −5V. The analog switch 135 performs a switching operation in response to the output signal from the filter 120 to output a −2-level signal of −10V.

The operation of the serial transfer system with the above-mentioned construction in accordance with the present invention will hereinafter be described in detail with reference to FIGS. 8a to 8d, which are waveform diagrams of the signals from the components in FIG. 5.

It should first be noted that the data is 8 bits, the data marker is 2 bits, and the vertical synchronous signal VS is 1 bit. The parallel data of 8 bits and the vertical synchronous signal VS of 1 bit from the transmission stage are applied to the parallel/serial converter 110 and the reference clock signal of 75 MHz from the PLL of the transmission stage is applied to the timing generator 140. In the timing generator 140, the reference clock signal of 75 MHz from the PLL of the transmission stage is amplified to the TTL level by the amplifier 141 and then applied to the clock generator 142 for the generation of the clock signal of 37.5 MHz (14×171H) necessary for the serial transfer.

Figure 8A:
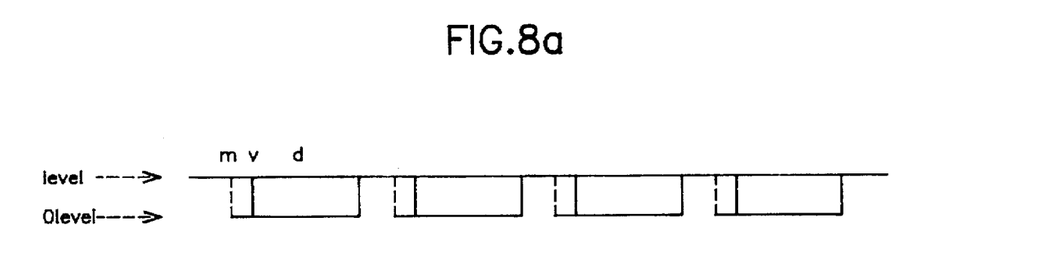
FIGS. 8a to 8d are waveform diagrams of signals from components in FIG. 5.

In the parallel/serial converter 110, the 8-bit parallel data and the 1-bit vertical synchronous signal VS from the transmission stage are converted into the serial data signal with the data marker appended in response to the clock signal of 37.5 MHz from the clock generator 142. The serial data signal A from the parallel/serial converter 110, as shown in FIG. 8a, has a waveform which has two levels, the 1-level and the 0-level and a sequence of the 2-bit data marker m of a high level, the 1-bit vertical synchronous signal v and 8-bit serial data d.

The serial data signal from the parallel/serial converter 110 is alternating current (AC)-coupled by the filter 120 for the removal of the DC component therefrom and then applied to the marker shaper 130. In the filter 120, the modulo-2 operation is performed with respect to the serial data signal from the parallel/serial converter 110 by the adder 121 together with the output signal from the delay 122 which delays the output signal from the adder 121. Then, the output signal from adder 121 is delayed by the delay 123 and applied to the subtracter 124. The output signal from the adder 121 is also applied directly to the subtracter 124, which subtracts the received signals from each other. The resultant signal from the subtracter 124 is fed to the marker shaper 130.

Figure 8B:
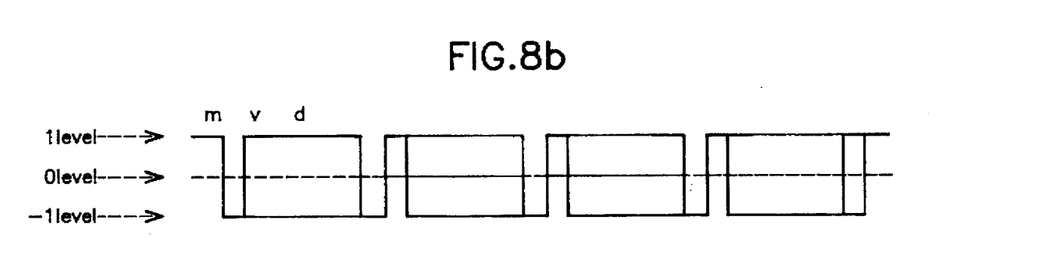

The AC-coupled signal B from the filter 120, as shown in FIG. 8b, has a waveform which has three levels, the 1-level, the 0-level and the −1-level and a sequence of the 2-bit data marker m of a high-low state or a low-high state, the 1-bit vertical synchronous signal v and the 8-bit serial data d. Namely, the serial data signal A from the parallel/serial converter 110 is varied from the two levels to the three levels by the filter 120.

The high-low state or the low-high state of the data marker m has the effect of facilitating the clock signal generation in the reception circuit 200.

Figure 8C:
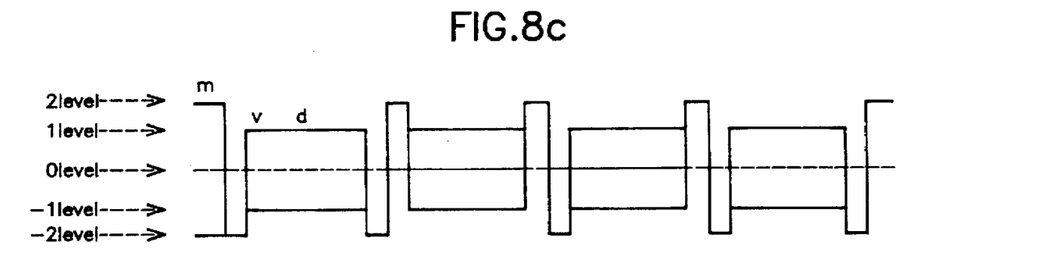
Figure 8D:
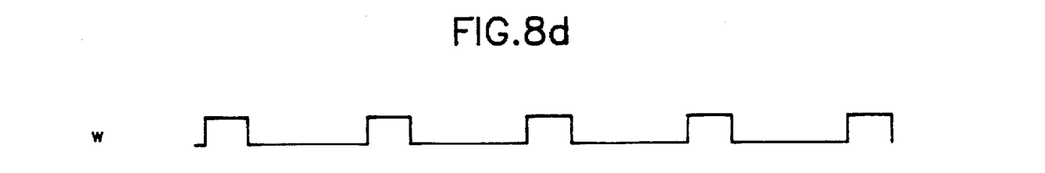

The output signal from the filter 120 is varied from the three levels to the five levels of +10V, +5V, 0V, −5V and −10V by the analog switches 131–135 in the marker shaper 130. Namely, the three level outputs x, y and z from the filter 120 are calculated on the basis equations of a=xy' and b=x'y and, then, with the data marker w. The results are ab'w, ab'w', a'b'w', a'bw', and a'bw, thereby causing the analog switches 131–135 to be controlled. As a result, the analog switches 131–135 provide their outputs as shown in FIG. 8c. In this case, the data marker has levels of +10V and −10V, thereby to facilitate the data marker slicing of the marker slicer 222. Therefore, the output from the marker slicer 222 has a waveform as shown in FIG. 8d.

Then, the serial data signal from the marker shaper 130 as shown in FIG. 8c is buffered and driven by the driver 150 so that it can be transmitted to the reception circuit 200 through the coaxial cable.

Figure 9:
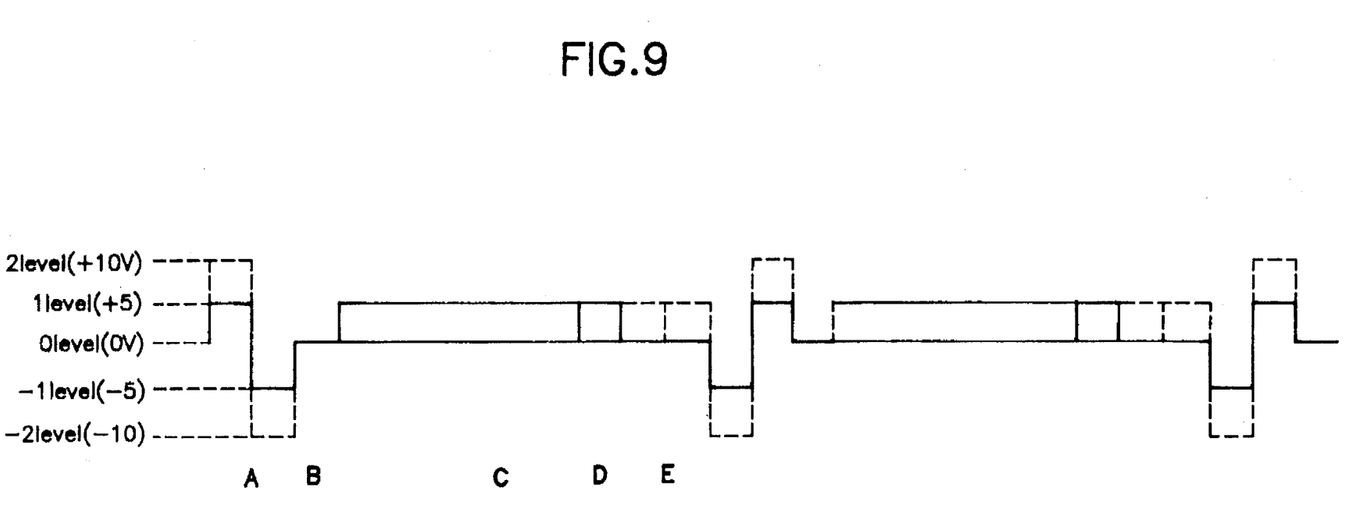
FIG. 9 is a view illustrating a format of a serial data signal in accordance with an embodiment of the present invention.

FIG. 9 is a view illustrating a format of the serial data signal in accordance with an embodiment of the present invention. As shown in FIG. 9, the serial data signal transmitted from the driver 150 in the transmission circuit 100 is comprised of five portions, the data marker A of 2 bits, the vertical synchronous signal B of 1 bit, the serial data C of 8 bits, an erasure signal D of 1 bit and unused 2 bits E, whereas the parallel data signal includes the parallel data of 8 bits, the vertical synchronous signal of 1 bit and the erasure signal of 1 bit. The clock signal for the serial transfer has the frequency (14×171H) of 14 times that of the clock for the parallel transfer, namely, 37.5 MHz, because a clock signal of 75 MHz (28×171H) is used in an HDTV and an HDVCR.

The data marker A is appended to the serial data signal in the unit of 14-bit word, and is used as a clock of 171H after being sliced by the marker slicer 222 in the reception circuit 200. The 2-bit data marker A appears being varied from −10V to +10V and vice versa, namely, from the −2-level to the 2-level and vice versa. The 1-bit vertical synchronous signal B appears between −5V and +5V or the 1-level and the −1-level subsequently to the transmission of the 2-bit data marker A. The 8-bit serial data C and the erasure signal D appear between −5V and +5V or the 1-level and the −1-level subsequent to the transmission of the vertical synchronous signal B, respectively.

On the other hand, in the reception circuit 200, the serial data signal transmitted through the coaxial cable is compensated for a distortion in the transmission by the amplifier 211 and the AGC 212 in the amplification circuit 210, thereby making the slicing operation ready. The output signal from the amplifier 211 in the amplification circuit 210 is applied to the data slicer 221 and the marker slicer 222, which slice the data and data marker portions of the received signal, respectively.

In the data slicer 221, the output signal from the amplifier 211 is sliced at the levels of 2.5V and −2.5V by the comparators 223 and 224 and then ORed by the OR gate 225. In the marker slicer 222, the output signal from the amplifier 211 is sliced at the levels of 7.5V and −7.5V by the comparators 226 and 227 and then ORed by the OR gate 228. As a result, the output from the marker slicer 222 has the waveform shown in FIG. 8D.

The output signal from the OR gate 225 in the data slicer 221 and the output signal from the OR gate 228 in the marker slicer 222 are applied to the vertical synchronous signal detector 231 in the timing generator 230, which detects the vertical synchronous signal VS from the output signal from the OR gate 225 in response to the output signal from the OR gate 228. Namely, since the vertical synchronous signal VS is transmitted subsequently to the data marker m, it is detected by retrieving the output signal from the data slicer 221 using the output signal from the marker slicer 222.

The detected vertical synchronous signal VS from the vertical synchronous signal detector 231 is applied as the reference control signal to the PLL 310 of the reception stage 300 to control it. In response to the vertical synchronous signal VS from the vertical synchronous signal detector 231, the PLL 310 of the reception stage is locked, so as to output the reference clock of 2.69 MHz (171H) to the amplifier 232 in the timing generator 230. The amplifier 232 amplifies the reference clock signal of 2.69 MHz from the PLL 310 of the reception stage 300 to the TTL level, thereby to generate the clock signal of 2.69 MHz for the parallel transfer. Then, the clock signal of 2.69 MHz from the amplifier 232 is supplied to the data detector 229 in the serial/parallel converter 220. In response to the clock signal from the amplifier 232, the data detector 229 detects the serial data from the output signal from the data slicer 221 and converts the detected serial data into the original parallel data. In result, the parallel data from the data detector 229 is applied to the reception stage 300 and processed thereby.

Figure 10A:
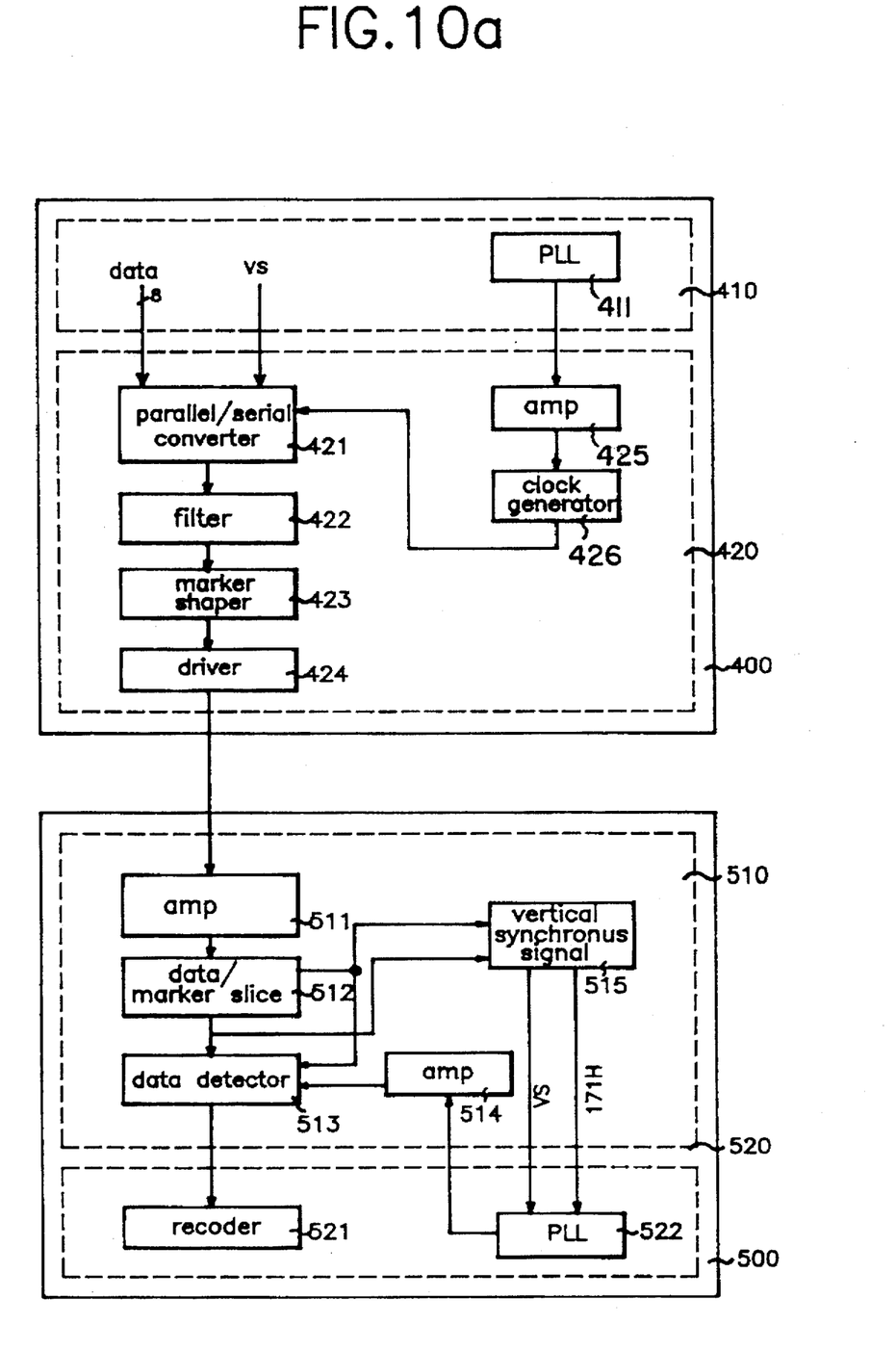
FIGS. 10a and 10b are block diagrams of a serial transfer system for performing serial data transfer between an HDTV and an HDVCR in accordance with an embodiment of the present invention.
Figure 10B:
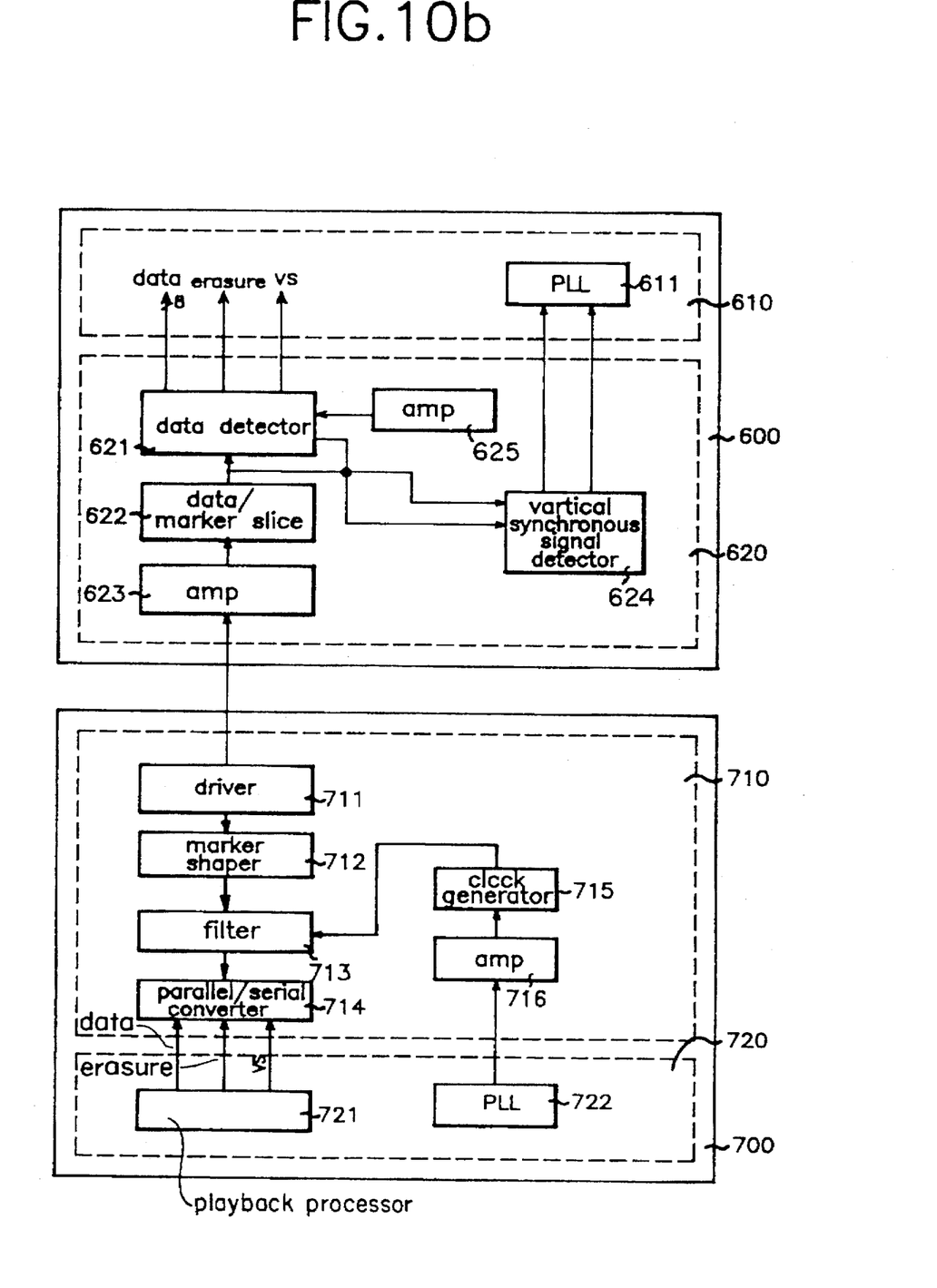

FIGS. 10a and 10b are block diagrams of a serial transfer system for performing serial data transfer between an HDTV 400 or 600 and an HDVCR 500 or 700 in accordance with an embodiment of the present invention. First, the operation of the serial transfer system will hereinafter be described in terms of a recording mode with reference to FIG. 10b.

Parallel data and a vertical synchronous signal VS from a transmission stage 410 of the HDTV 400 are applied to a transmission circuit 420 of the HDTV 400. A reference clock signal of 75 MHz from a PLL 411 of the transmission stage 410 is also applied to the transmission circuit 420.

In the transmission circuit 420, the reference clock of 75 MHz from the PLL 411 of the transmission stage 410 is amplified by a TTL level by an amplifier 425 and then applied to a clock generator 426 for generation of a clock signal of 37.5 MHz necessary to the serial transfer. The clock signal of 37.5 MHz from the clock generator 426 is supplied to a parallel/serial converter 421.

In the parallel/serial converter 421, the parallel data and the vertical synchronous signal VS from the transmission stage 410 are converted into a serial data signal and a data marker is appended in response to the clock signal of 37.5 MHz from the clock generator 426. The serial data signal from the parallel/serial converter 421 has the format as shown in FIG. 9.

The serial data signal from the parallel/serial converter 421 is AC-coupled by a filter 422 to have three levels and then processed by a marker shaper 423 to have five levels.

The serial data signal from the marker shaper 423 is buffered and driven by a driver 424 and then transmitted to a reception circuit 510 of the HDVCR 500 through a coaxial cable of 75Ω.

In the reception circuit 510, the serial data signal transmitted through the coaxial cable is compensated for a distortion in the transmission by an amplifier 511 and then applied to a data/marker slicer 512 which slices data and data marker portions of the received signal at levels of 2.5V and −2.5V and at levels of 7.5V and −7.5V, respectively.

The sliced data and data marker portions from the data/marker slicer 512 are applied to a vertical synchronous signal detector 515, which detects the vertical synchronous signal VS from the sliced data portion in response to the sliced data marker portion. A PLL 522 of a reception stage 520 is locked in response to the vertical synchronous signal VS from the vertical synchronous signal detector 515, so as to output a reference clock signal of 2.69 MHz to an amplifier 514 in the reception circuit 510. The amplifier 514 amplifies the reference clock signal of 2.69 MHz from the PLL 522 of the reception stage 520 by the TTL level, thereby to generate a clock signal of 2.69 MHz for parallel transfer. In response to the clock signal from the amplifier 514, a data detector 513 detects serial data from the output signal from the data/marker slicer 512 and converts the detected serial data into the original parallel data. In result, the parallel data from the data detector 513 is applied to a recording processor 521 of the reception stage 520 and then recorded thereby.

Next, the operation of the serial transfer system will hereinafter be described in terms of a playback mode with reference to FIG. 10B. The playback mode is performed in the reverse order of the recording mode.

A reference clock signal of 75 MHz from a PLL 722 of a transmission stage 720 in the HDVCR 700 is applied to a transmission circuit 710 of the HDVCR 700. Also, 8-bit parallel data, an erasure signal, and a vertical synchronous signal VS from a playback processor 721 in the transmission stage 720 are applied to the transmission circuit 710.

In the transmission circuit 710, the reference clock signal of 75 MHz from the PLL 722 of the transmission stage 720 is amplified to a TTL level by an amplifier 716 and then applied to a clock signal generator 715 for generation of a clock signal of 37.5 MHz necessary to the serial transfer. The clock signal of 37.5 MHz from the clock generator 715 is supplied to a parallel/serial converter 714.

In the parallel/serial converter 714, the parallel data, the erasure signal and the vertical synchronous signal VS from the playback processor 721 are converted into a serial data signal and a data marker is appended in response to the clock of 37.5 MHz from the clock generator 715. The serial data signal from the parallel/serial converter 714 has the format as shown in FIG. 9.

The erasure signal is outputted from the HDVCR 700 when the presence of an error is discriminated based on a vague state of sliced data.

The serial data signal from the parallel/serial converter 714 is AC-coupled by a filter 713 to have three levels and then processed by a marker shaper 712 to have five levels. The output signal from the marker shaper 712 is buffered and driven by a driver 711 and then transmitted to a reception circuit 620 of the HDTV 600 through a coaxial cable of 75Ω.

In the reception circuit 620, the serial data signal transmitted through the coaxial cable is compensated for a distortion in the transmission by an amplifier 623 and then applied to a data/marker slicer 622 which slices data and data marker portions of the received signal at levels of 2.5V and −2.5V and at levels of 7.5V and −7.5V, respectively.

The sliced data and data marker portions from the data/marker slicer 622 are applied to a vertical synchronous signal detector 624, which detects the vertical synchronous signal VS from the sliced data portion in response to the sliced data marker portion. A PLL 611 of a reception stage 610 is locked in response to the vertical synchronous signal VS from the vertical synchronous signal detector 624, so as to output a reference clock signal of 2.69 MHz to an amplifier 625 in the reception circuit 620. The amplifier 625 amplifies the reference clock signal of 2.69 MHz from the PLL 611 of the reception stage 610 by the TTL level, thereby to generate a clock signal of 2.69 MHz for parallel transfer. In response to the clock signal from the amplifier 625, a data detector 621 detects serial data from the output signal from the data/marker slicer 622 and converts the detected serial data into the original parallel data. In result, the parallel data from the data detector 621 is applied to the reception stage 610 and then reproduced thereby. In other words, the 8-bit parallel data from the data detector 621, the 1-bit erasure signal and the 1-bit vertical synchronous signal are transferred to the HDTV reception stage 610.

As apparent from the above description, according to the present invention, the clock signal is reproducible with no use of a separate PLL, resulting in simplification in a hardware. Also, the signal transmission of the five levels makes the clock reproduction in the signal reception easy. Further, the use of the PLLs in the transmission and reception stages has the effect of reducing the cost.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A serial transfer system for performing serial data transfer between transmission and reception stages which phase locked loops for generating reference clock signals, said system comprising:

transmission means for converting parallel data from said transmission stage into a serial data signal, for appending a data marker to the serial data signal in response to the reference clock signal from said phase locked loop of said transmission stage, and for transmitting the converted serial data signal through a coaxial cable; and reception means for receiving the serial data signal from said transmission means through the coaxial cable, converting the received serial signal into the original parallel data using the appended data marker and the reference clock signal from said phase locked loop of said reception stage and outputting the converted parallel data to said reception stage, wherein said transmission means includes:

timing generation means for generating a clock signal for serial transfer in response to the reference clock signal from said phase locked loop of said transmission stage;

parallel/serial conversion means for converting the parallel data from said transmission stage into the serial data signal and appending the data marker to the parallel data in response to the clock signal from said timing generation means;

filtering means for removing a direct current component from the serial data signal from said parallel/serial conversion means;

marker shaping means for varying the number of voltage levels of an output signal from said filtering means to facilitate data marker slicing; and driving means for buffering and driving an output signal from said marker shaping means to transmit the output signal from said marker shaping means through the coaxial cable.

2. A serial transfer system as set forth in claim 1, wherein said timing generation means includes:

an amplifier for amplifying the reference clock signal from said phase locked loop of said transmission stage by a transistor transistor logic level; and a clock generator for generating the clock signal for the serial transfer in response to an output signal from said amplifier and outputting the generated clock signal to said parallel/serial conversion means.

3. A serial transfer system as set forth in claim 2, wherein the clock signal from said clock generator has a frequency of 37.5 MHz.

4. A serial transfer system as set forth in claim 1, wherein said marker shaping means varies the number of the voltage levels of the output signal from said filtering means from 3 to 5 to facilitate the data marker slicing.

5. A serial transfer system as set forth in claim 4, wherein said marker shaping means includes:

a first analog switch for performing a switching operation in response to the output signal from said filtering means to output a 2-level signal of +10V;

a second analog switch for performing a switching operation in response to the output signal from said filtering means to output a 1-level signal of +5V;

a third analog switch for performing a switching operation in response to the output signal from said filtering means to output a 0-level signal of 0V;

a fourth analog switch for performing a switching operation in response to the output signal from said filtering means to output a −1-level signal of −5V; and a fifth analog switch for performing a switching operation in response to the output signal from said filtering means to output a −2-level signal of −10V.

6. A serial transfer system as set forth in claim 1, wherein said filtering means includes:

an adder for performing a modulo-2 operation with respect to the serial data signal from said parallel/serial conversion means;

a first delay for delaying an output signal from said adder and feeding back the delayed signal to said adder;

a second delay for delaying the output signal from said adder; and a subtracter for subtracting the output signal from said adder from an output signal from said second delay.

7. A serial transfer system as set forth in claim 1, wherein the transmission means converts parallel data into a serial data signal and appends a data marker at the same time.

8. A serial transfer system for performing serial data transfer between transmission and reception stages which have phase locked loops for generating reference clock signals said system comprising:

transmission means for converting parallel data from said transmission stage into a serial data signal, for appending a data marker to the serial data signal in response to the reference stage, and for transmitting the converted serial data signal through a coaxial cable; and reception means for receiving the serial data signal from said transmission means through the coaxial cable, converting the received serial data signal into the original parallel data using the appended data marker and the reference clock signal from said phase locked loop of said reception stage and outputting the converted parallel data to said reception stage;

said reception means including:

amplification means for receiving the serial data signal from said transmission means through the coaxial cable and amplifying the received serial data signal;

serial/parallel conversion means for slicing an output signal from said amplification means, for converting the sliced signal into the original parallel data, and for outputting the converted parallel data to said reception stage;

timing generation means for controlling said phase locked loop of said reception stage according to the data marker from said serial/parallel conversion means, for generating a clock signal for parallel transfer in accordance with the controlled result, and for outputting the generated clock signal to said serial/parallel conversion means, wherein said serial/parallel conversion means includes:

a data slicer for slicing a data portion of the output signal from said amplification means;

a marker slicer for slicing a data portion of the output signal from said amplification means;

a marker slicer for slicing a data marker portion of the output signal from said amplification means; and a data detector for detecting serial data from an output signal from said data slicer in response to the clock from said timing generation means, converting the detecting serial data into the original parallel data and output the converted parallel data to said reception stage.

9. A serial transfer system as set forth in claim 8, wherein said timing generation means includes:

a vertical synchronous signal detector for detecting a vertical synchronous signal from the output signal from said data slicer in said serial/parallel conversion means in response to an output signal from said marker slicer in said serial/parallel conversion means and for outputting the detected vertical synchronous signal as a reference control signal for controlling generation of the reference clock signal in said phase locked loop of said reception stage; and an amplifier for amplifying the reference clock from said phase locked loop of said reception stage to a transistor transistor logic level to generate the clock signal for the parallel transfer and outputting the generated clock signal to said data detector in said serial/parallel conversion means.

10. A serial transfer system as set forth in claim 9, wherein the clock signal from said amplifier has a frequency of 2.69 MHz.

11. A serial transfer system as set forth in claim 8, wherein said data slicer includes:

a first comparator for comparing a level of the output signal from said amplification means with a reference voltage of 2.5V;

a second comparator for comparing the level of the output signal from said amplification means with a reference voltage of −2.5V; and an OR gate for ORing output signals from said first and second comparators and outputting the ORed signal to said data detector and said timing generation means.

12. A serial transfer system as set forth in claim 11, wherein said first and second comparators have upper and lower limit voltages of +5V and −5V for the comparison, respectively.

13. A serial transfer system as set forth in claim 8, wherein said marker slicer includes:

a first comparator for comparing a level of the output signal from said amplification means with a reference voltage of 7.5V;

a second comparator for comparing the level of the output signal from said amplification means with a reference voltage of −7.5V; and an OR gate for ORing output signals from said first and second comparators and outputting the ORed signal to said timing generation means.

14. A serial transfer system as set forth in claim 13, wherein said first and second comparators have upper and lower limit voltages of +10V and −10V for the comparison, respectively.

* * * * *

UNITED STATES PATENT AND TRADEMARK OFFICE
CERTIFICATE OF CORRECTION

PATENT NO. : 5,721,755
DATED : February 24, 1998
INVENTOR(S) : KIM et al.

It is certified that error appears in the above-identified patent and that said Letters Patent is hereby corrected as shown below:

Claim 8, column 12, line 25, after "reference", insert
--clock signal from said phase locked loop of said transmission--.

Title page, item [57], line 5 of Abstract, delete "a" ;
                line 8, "signals" should read --signal--; and
                line 15, after "stage", insert --,--.

Signed and Sealed this

Ninth Day of March, 1999

Attest:

Attesting Officer

Q. TODD DICKINSON

Acting Commissioner of Patents and Trademarks